(12) United States Patent
Erickson et al.

(10) Patent No.: US 12,299,285 B2
(45) Date of Patent: May 13, 2025

(54) COMPRESSED MEMORY BUFFER DEVICE

(71) Applicant: Rambus Inc., San Jose, CA (US)

(72) Inventors: Evan Lawrence Erickson, Chapel Hill, NC (US); Christopher Haywood, Cary, NC (US); Craig E. Hampel, Los Altos, CA (US)

(73) Assignee: Rambus Inc., San Jose, CA (US)

( * ) Notice: Subject to any disclaimer, the term of this patent is extended or adjusted under 35 U.S.C. 154(b) by 0 days.

(21) Appl. No.: 18/218,831

(22) Filed: Jul. 6, 2023

(65) Prior Publication Data
US 2024/0012565 A1 Jan. 11, 2024

Related U.S. Application Data

(60) Provisional application No. 63/358,663, filed on Jul. 6, 2022.

(51) Int. Cl.
*G06F 3/06* (2006.01)

(52) U.S. Cl.
CPC .......... *G06F 3/0611* (2013.01); *G06F 3/0608* (2013.01); *G06F 3/0659* (2013.01); *G06F 3/0673* (2013.01)

(58) Field of Classification Search
None
See application file for complete search history.

(56) References Cited

U.S. PATENT DOCUMENTS

| | | | |
|---|---|---|---|
| 6,523,102 B1* | 2/2003 | Dye | G06F 12/08 711/170 |
| 7,533,234 B2 | 5/2009 | Rudelic et al. | |
| 8,370,544 B2 | 2/2013 | Lu et al. | |
| 9,015,390 B2 | 4/2015 | Klein | |
| 9,947,298 B2 | 4/2018 | Skinner et al. | |
| 2001/0001872 A1* | 5/2001 | Singh | G06F 12/127 711/E12.043 |
| 2003/0061457 A1* | 3/2003 | Geiger | G06F 12/08 711/165 |
| 2016/0124683 A1* | 5/2016 | Zhang | G06F 3/0616 711/154 |
| 2016/0125568 A1 | 5/2016 | Jeacocke | |
| 2019/0265914 A1* | 8/2019 | Schauer | G06F 13/4282 |
| 2021/0311900 A1* | 10/2021 | Malladi | G06F 12/1045 |
| 2021/0318819 A1* | 10/2021 | Mun | G06F 3/0653 |
| 2023/0236979 A1* | 7/2023 | Geng | G06F 12/0886 711/118 |

\* cited by examiner

*Primary Examiner* — Kaushikkumar M Patel
(74) *Attorney, Agent, or Firm* — Lance Kreisman; Peninsula Patent Group

(57) ABSTRACT

A buffer integrated circuit (IC) chip is disclosed. The buffer IC chip includes host interface circuitry to receive a request from at least one host. The request includes at least one command to perform a memory compression operation on first uncompressed data that is stored in a first memory region. Compression circuitry, in response to the at least one command, compresses the first uncompressed data to first compressed data. The first compressed data is transferred to a second memory region.

20 Claims, 9 Drawing Sheets

COMPRESSED MEMORY BUFFER DEVICE

CROSS-REFERENCE TO RELATED APPLICATIONS

This application is a Non-Provisional that claims priority to U.S. Provisional Application No. 63/358,663 filed Jul. 6, 2022, entitled COMPRESSED MEMORY BUFFER DEVICE, which is incorporated herein by reference in its entirety.

TECHNICAL FIELD

The disclosure herein relates to compressed memory devices, related methods, systems and modules that employ such devices.

BRIEF DESCRIPTION OF THE DRAWINGS

Embodiments of the disclosure are illustrated by way of example, and not by way of limitation, in the figures of the accompanying drawings and in which like reference numerals refer to similar elements and in which.

DETAILED DESCRIPTION

Embodiments of compressed memory buffer devices, methods, systems and associated integrated circuit devices are disclosed herein. One embodiment of a buffer integrated circuit (IC) chip described herein includes host interface circuitry to receive a request from at least one host. The request includes at least one command to perform a memory compression operation on first uncompressed data that is stored in a first memory region. Compression circuitry, in response to the at least one command, compresses the first uncompressed data to first compressed data. The first compressed data is transferred to a second memory region. By offloading memory compression operations to a buffer device, but managing the operations by a host, various tiers of memory may be utilized in an optimal manner, thus reducing overall latency and improving performance. Additionally, offloading the memory compression/decompression operations to the buffer device reduces utilization of the host since it no longer needs to carry out such operations. Moreover, in some situations, having the buffer device perform the memory compression/decompression operations may reduce the amount of data transferred between the host and buffer device.

Figure 1:
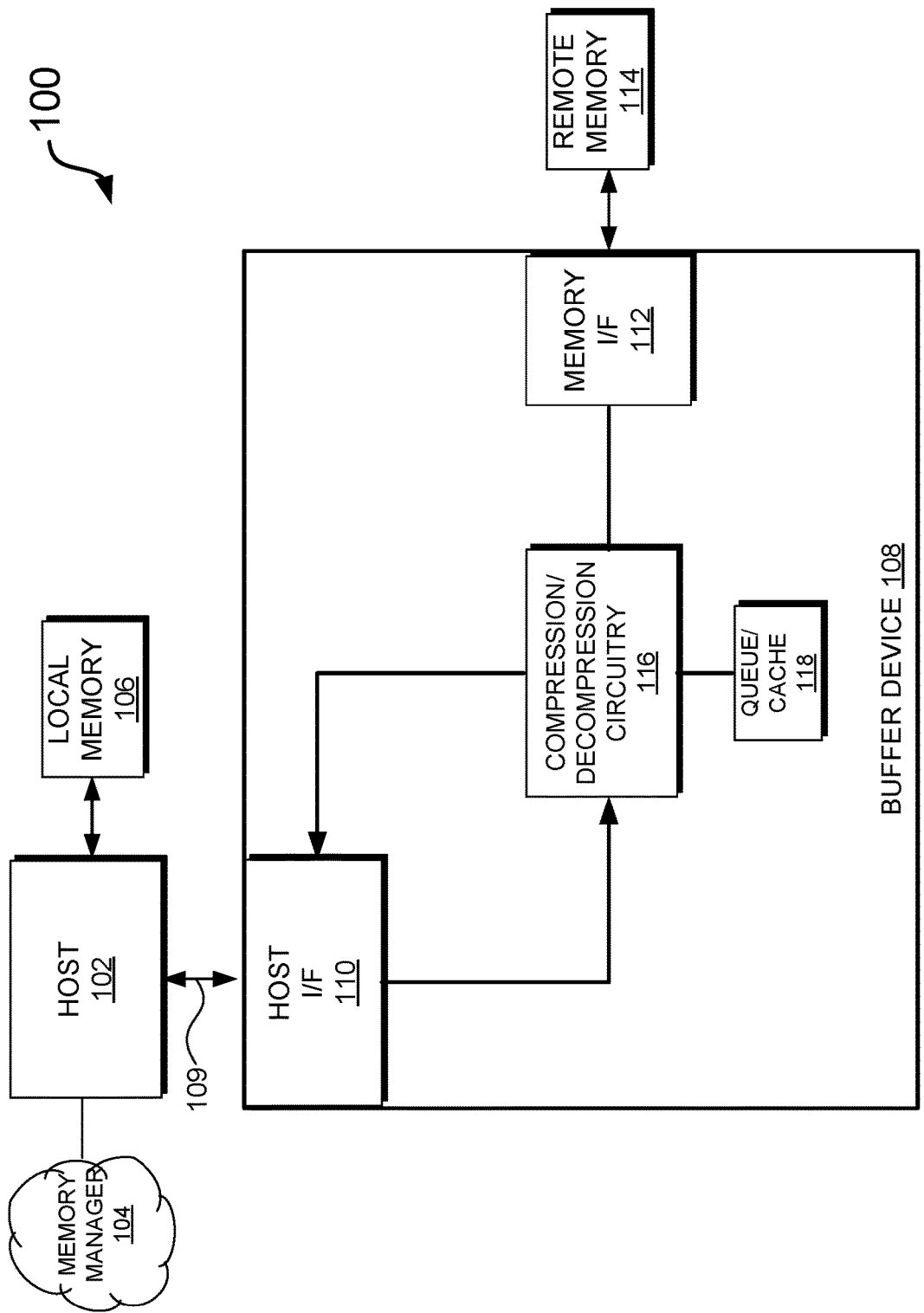
FIG. 1 illustrates one embodiment of a compressed memory buffer device.

Referring now to FIG. 1, one embodiment of a memory system, generally designated 100, includes a host 102 such as a server or other form of general purpose processor that may communicate with other processors to provide data or services over a network. The host 102 manages a pool of memory via a host memory manager 104 associated with a host operating system (OS). For one embodiment, the host memory manager 104 performs a variety of memory management tasks associated with the pool of memory, including tracking allocated and unallocated memory in multiple memory tiers, and freeing memory via swapping operations. The swapping operations may involve controlling memory compression and decompression operations. In one specific embodiment, the host memory manager 104 provides functions similar to a software application known under the name Zswap, a Linux kernel module that generally takes pages of memory that are in the process of being swapped-out (to free-up memory) and compresses them into a dynamically allocated RAM-based memory pool. For some embodiments, the memory pool may include a first tier of memory, referred to herein as local memory 106, that is directly connected to the host 102, without hops between intermediate devices. The memory pool may also include further tiers of memory that are remote from the host 102, but accessible to the host 102 via a buffer device 108.

Further referring to FIG. 1, the buffer device 108 includes a host interface 110 to bidirectionally communicate with the host 102 via a signaling link 109. For one specific embodiment, the host interface 110 is configured to receive requests from the host 102 that are encrypted with a link encryption code and integrity protected, such as with a message authentication code (MAC). The requests may take the form of commands, data and/or interrupts. The host interface 110 may also dispatch responses from the buffer device 108 to the host 102. The responses may include, for example, read data and/or acknowledgements to previously received requests. In certain embodiments, as explained more fully below with respect to FIG. 7, the host interface 102 may include a high-bandwidth Compute Express Link (CXL) interface.

With continued reference to FIG. 1, a memory interface 112 couples the buffer device 108 to remote memory 114, often referred to as device memory or module memory, that includes one or more integrated circuit (IC) dynamic random access memory (DRAM) devices. For one embodiment, the buffer device 108 and the remote memory 114 are disposed on a substrate (not shown) to form a memory module. An uncompressed region of the remote memory 114 may generally be managed by the host memory manager 104 as a second tier of memory, referred to herein as uncompressed remote memory.

Further referring to FIG. 1, for one embodiment, the buffer device 108 includes compression/decompression circuitry 116 that provides hardware acceleration capability in performing memory compression and decompression operations in response to commands and/or other instructions received from the host 102. For some embodiments, data that is compressed by the compression/decompression circuitry 116 may be stored in a temporary queue or cache 118 and/or transferred to a compressed region of the remote memory 114. For one embodiment, the compressed region of the remote memory 114 is generally managed by the host memory manager 104 as a third tier of memory, referred to herein as compressed remote memory.

Figure 2:
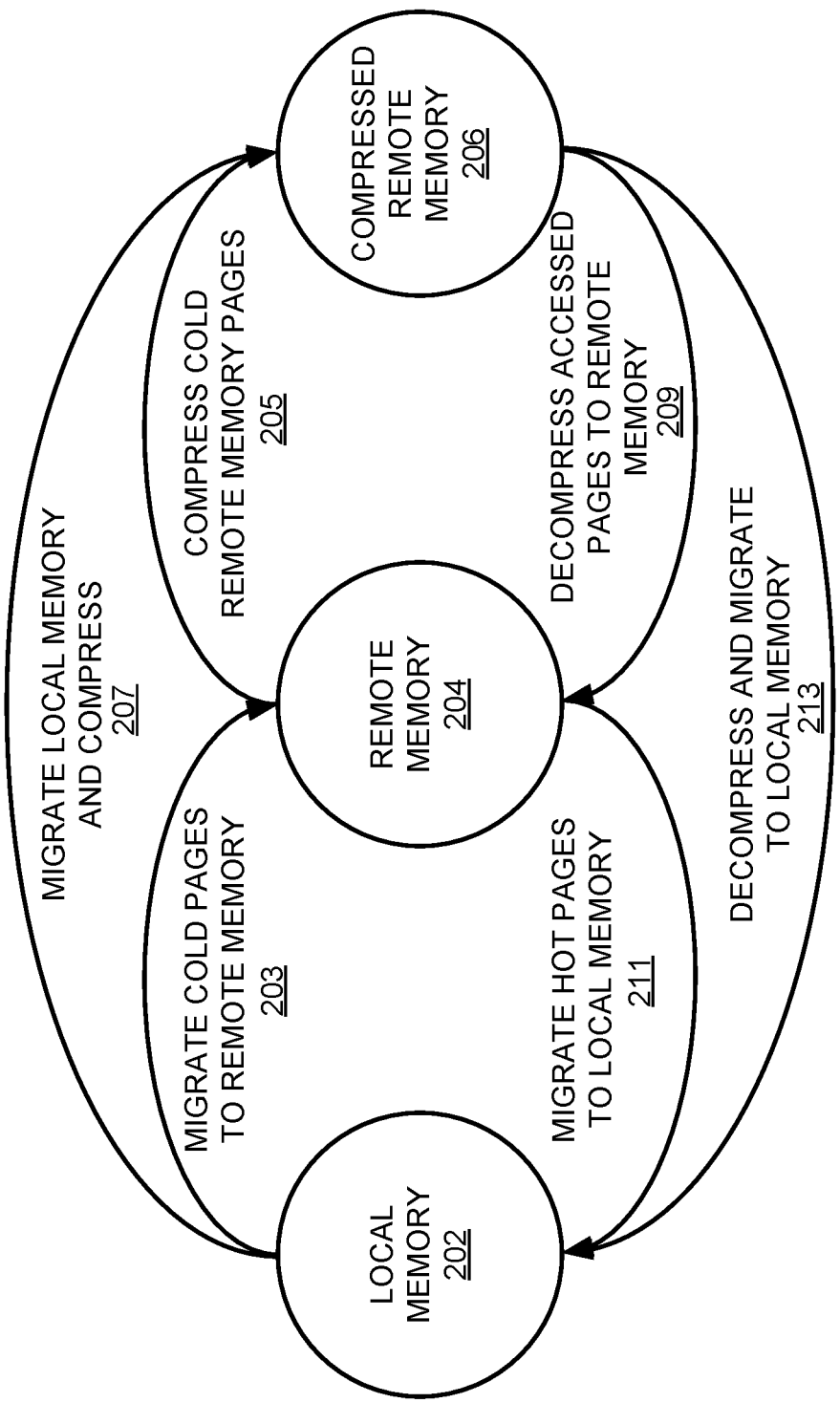
FIG. 2 illustrates multiple tires of memory associated with one embodiment of the compressed memory buffer device of FIG. 1.

As noted above, utilizing the buffer device 108 to perform memory compression operations under the guidance of the host memory manager 104 provides the host 102 with low-latency access to the three tiers of memory during operation. FIG. 2 illustrates one embodiment of a state diagram illustrating the potential memory tier selections available to the host memory manager 104. As explained above, for one embodiment, local memory 202 is memory from an available pool of memory that is directly accessible by the host 102 via a direct-connect memory interface (not shown). In most cases, the local memory 202 is managed to store data that can take advantage of the low-latency spatial locality of the directly-accessible local memory with respect to the host 102. Uncompressed remote memory 204 is uncompressed memory from the memory pool that is accessible via the buffer device 108, with a latency higher than that of the local memory 202. In some instances, uncompressed data may be accessed via sequences of fine-granularity load/store access operations. Compressed remote memory 206 is compressed memory from the memory pool that is also accessible via the buffer device 108, but generally needs to be uncompressed before portions may be read from or written to memory.

Further referring to FIG. 2, in many situations, the host memory manager 104 may elect to step through the memory tiers, back and forth, depending on how often the particular page of data needs to be accessed, and depending on whether the local memory 202 needs freed-up space. As examples of write-related tier-stepping, one or more pages of data stored in local memory 202 may become "cold" over time and, at 203, migrated to the uncompressed remote memory 204 in order to free memory in the local memory 202. At some point, the host memory manager 104 may need to free up more space in the uncompressed remote memory 204 and may instruct the buffer device 108 to compress cold remote memory pages, at 205, and store the resulting compressed data in the compressed remote memory 206. In some instances, the host memory manager 104 may choose to migrate local memory directly to the compressed remote memory 206, such as at 207.

For some embodiments, when one or more pages (or cache lines) of memory are compressed and migrated to another tier, accesses to the migrated memory generally involve decompressing and re-migrating the compressed memory back to the uncompressed remote memory 204 and/or the local memory 202. With continued reference to FIG. 2, examples of read-related tier stepping may involve decompressing accessed pages from compressed remote memory 206, to uncompressed remote memory 204, at 209. Hot pages of the uncompressed remote memory 204 may be migrated to the local memory 202, at 211. Alternatively, compressed pages of the compressed remote memory 206 may be decompressed and migrated directly to the local memory 202, at 213.

Figure 3:
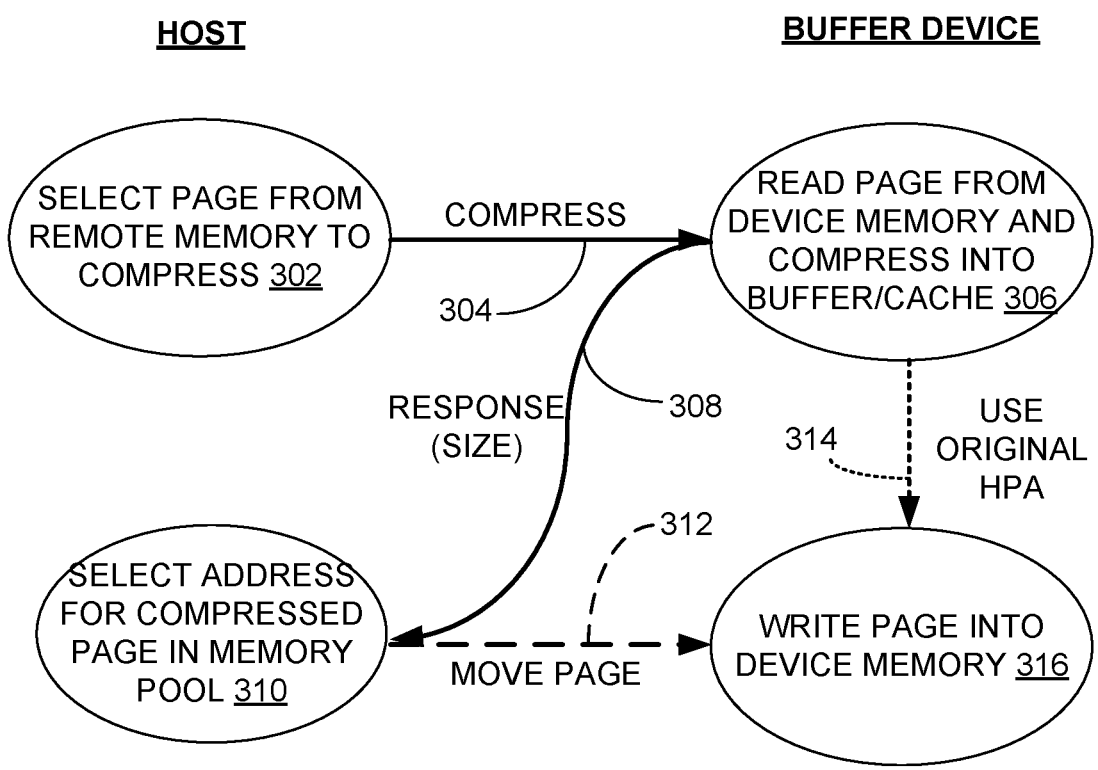
FIG. 3 illustrates one embodiment of a compression operation between a host and a memory module that employs one embodiment of the IDE buffer device of FIG. 1.
Figure 4A:
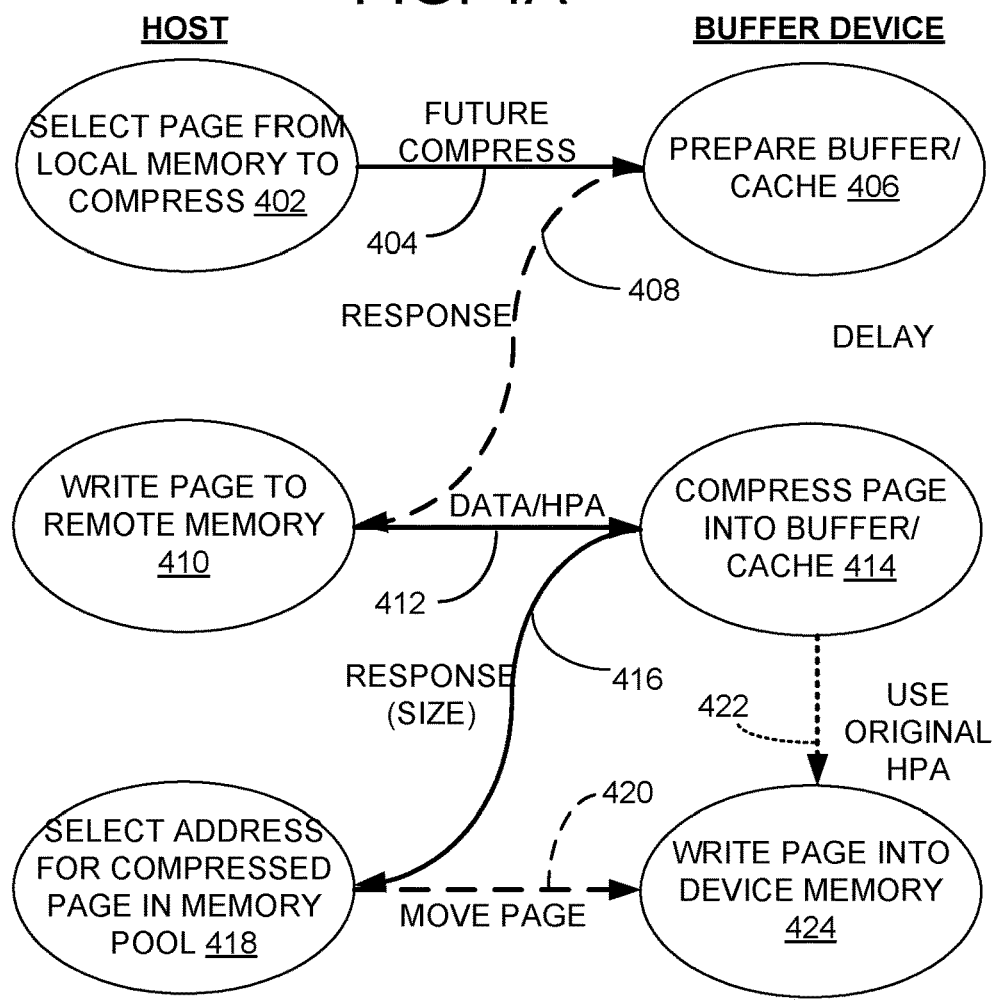
FIGS. 4A and 4B illustrate further embodiments of compression operations similar to that of FIG. 3.
Figure 4B:
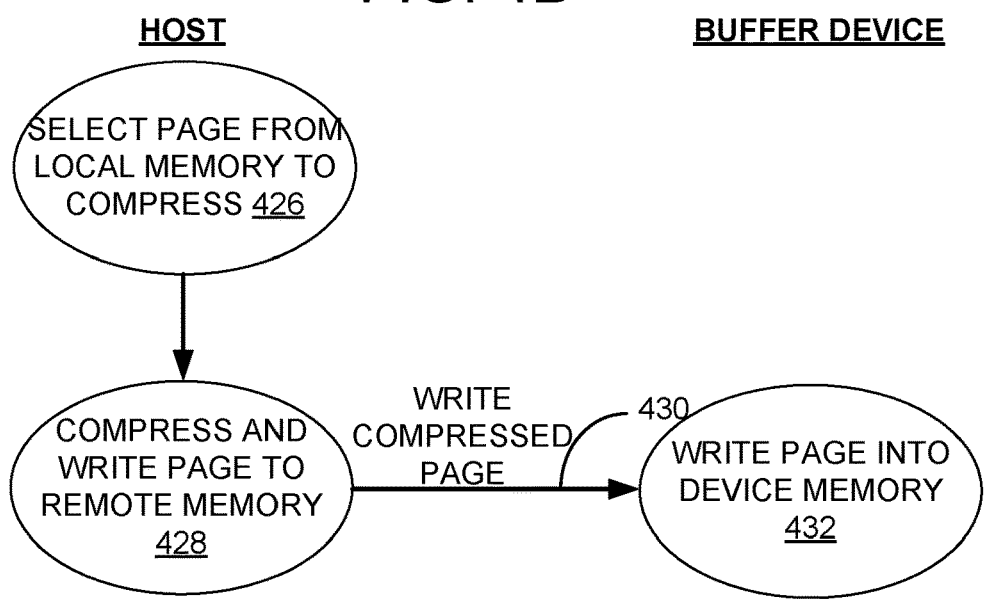

FIGS. 3, 4A and 4B illustrate respective state diagrams involving different forms of memory compression operations between the host 102 and the buffer device 108. Referring now to FIG. 3, for one embodiment, the host memory manager 104 controls a device-to-device compression operation. One context of the "device" is a device other than the host 102, such as the buffer device 108. This involves the host memory manager 104 selecting a page from the remote memory 114 to compress, at 302, and dispatching an API call in the form of a "compress" command 304 and host physical address (HPA) information associated with the selected page to the buffer device 108. The host memory manager 104 updates its allocated/unallocated page tables to account for the temporary unavailability of the uncompressed page such that, when needed, a request to access the uncompressed page results in, for one specific example, a page fault condition that triggers decompression operations explained below with respect to FIGS. 5, 6A and 6B. For some embodiments, the HPA reflects the address in the same physical address space used by the host 102 to access the local memory 202, and thus the address stored in the page tables maintained by the host memory manager 104, or potentially a hypervisor for embodiments that employ virtualization.

While many of the embodiments described herein perform memory access, compression, decompression and migration operations at a page level of granularity, other embodiments may perform such operations on larger or smaller units of the pooled memory. Further, the pooled memory may also include cache storage, and thus operations described herein involving cache storage may be performed at a cache line level of granularity.

Further referring to FIG. 3, for one embodiment, the buffer device 108 responds to the compress command from the host 102 by autonomously performing multiple operations to (1) to send a read command to the remote memory 114 to retrieve the uncompressed page from the remote memory 114 and (2) control the compression circuitry 116 to compress the page and temporarily store the compressed page into the cache circuitry 118, at 306. The buffer device 108, in response to the compress command, also autonomously determines the size of the compressed page, which is usually less than the uncompressed size of the page, and sends information representing the size as a response back to the host 102, at 308. In some embodiments, if the compressed page is not sufficiently reduced below a predefined threshold size, then the buffer device 108 may generate a response indicating a failure in the compression operation. Once receiving the failure response, the host 102 may abort the compression operation and maintain the uncompressed address in the page tables.

With continued reference to FIG. 3, and assuming a successful compression operation on the part of the buffer device 108, for one embodiment, the host memory manager 104 may then select a new host physical address (HPA) for the compressed page in the memory pool, at 310, and dispatch a "move page" command, at 312, to the buffer device 108, along with the new HPA information. The buffer device 108 then writes the compressed page into compressed remote memory, at 316. Alternatively, instead of the host memory manager 104 selecting a new HPA for the compressed page, the buffer device 108 may reuse the original HPA used to store the uncompressed page, at 314, and write the compressed page into the remote memory, at 316. This effectively overwrites a portion of the uncompressed data with the compressed version of the same data. In autonomously performing multiple operations in response to a single command, the buffer device 108 is able to minimize the bandwidth usage of the signaling link attributable to commands and other components of various memory access requests.

The steps illustrated in the state diagram of FIG. 3 generally correspond to a "stepped" transition of a given page stored in the uncompressed remote memory tier 204 (FIG. 2) to the compressed remote memory tier 206 (FIG. 2).

While FIG. 3 illustrates a device-to-device context for a compression operation managed by the host memory manager 104 and carried out by the buffer device 108, FIG. 4A illustrates a state diagram for a host-to-device compression operation that generally corresponds to a page being migrated from local memory 202 (FIG. 2) directly to compressed remote memory 206 (FIG. 2), while offloading compression operations to the buffer device 108.

Referring now to FIG. 4A, for one embodiment, the host-to-device compression operation is performed in a device-driven manner, where the actual compression is offloaded to, and carried out by the buffer device 108. The operation begins with the host memory manager 104 selecting a page from local memory 202 (FIG. 2) to compress, at 402. The host memory manager 104 may then dispatch a future compress command, at 404, along with an HPA, to the buffer device 108, to prepare the queue/cache circuitry 118, at 406, for temporarily storing data associated with the HPA when received. This advantageously allows for temporarily holding the data that will be compressed in the cache until its able to be compressed by the buffer compression circuitry. The overall architecture thus prevents the uncompressed data from being written to the remote memory 114 prior to compression, thus reducing memory bandwidth usage by avoiding unnecessary store commands to the remote memory 114, and unnecessary load commands to then retrieve the data for compression. In some embodiments, the buffer device 108 may optionally send an acknowledgement response back to the host 102, at 408. Other embodiments may omit the response. The host memory manager 104 then proceeds by transferring the data stored in the local memory page to the uncompressed remote memory 204, at 410, with an associated HPA, at 412. For a load and store memory architecture, this may involve multiple store operations, with the host memory manager 104, in one embodiment, configuring direct memory access (DMA) read operations from the local memory 202 and write operations to the uncompressed remote memory 204. For some embodiments, a DMA engine or entity that performs the load from local memory and the store to remote memory may reside in the buffer device 108.

Further referring to FIG. 4A, as the buffer device 108 receives the write data from the host 102, the uncompressed write data, for one embodiment, is temporarily stored in the specified HPA of the uncompressed remote memory and compressed by the compression circuitry 116, at 414. For some embodiments, the uncompressed data may be sent to the cache where it would be accessible by the specified HPA. Should the host abort the compression operation, this copy of the uncompressed data would exist and be written to the remote memory 114 upon cache eviction. Following compression, the compressed data may be temporarily stored in the queue/cache circuitry 118. In some situations, the compressed data is not necessarily stored at the same HPA in the queue/cache circuitry 118 as the uncompressed data transferred from the host 102. This is due to the flexibility of the host 102 in aborting the compression operation, if needed. Thus, the compressed data may be directed to a different queue/cache region of memory or to the same queue/cache region where the uncompressed data is temporarily stored. For some embodiments, the compression may begin once all of the write data is received and written to the remote memory 204. Other embodiments may sequentially stream portions of the write data through the compression circuitry 116 without waiting for all of the write data to be received from the host 102. Once the compression of the data is complete, the size of the resulting page is communicated back to the host memory manager 104 as a response, at 416. For one embodiment, once the size of the compressed data is received, the host memory manager 104 selects a new HPA for the compressed page in the memory pool, at 418, and dispatches a move command, at 420, for the buffer device 108 to write the compressed page to the newly selected HPA in the remote memory 114, at 424. In other embodiments, the original HPA associated with the uncompressed remote memory 204 may be reused, at 422, to store the compressed page. The compressed page may then be written back to either the original HPA or the new HPA, at 424, without incurring any additional latency, overhead, or memory accesses.

In one alternative embodiment, the host-to-device compression operation is performed in a host-driven manner, where the actual compression is carried out by the host device 102. With reference to FIG. 4B, the operation begins with the host memory manager 104 selecting a page from local memory to compress, at 426. In some embodiments, the host memory manager 104 may then compress the page via, for example, a first predefined compression scheme, and to write the compressed page to remote memory, at 428, by dispatching one or more write commands, at 430, to the buffer device 108 to write the compressed page to remote memory, at 432. For some embodiments, the one or more write commands may involve a series of writes, or stores, to HPA's in remote memory to transfer a full page of memory. In situations where the buffer device compression/decompression circuitry 116 is compatible with the host predefined compression scheme, subsequent decompression operations on the compressed page may be carried out by the buffer device compression/decompression circuitry 116.

Figure 5:
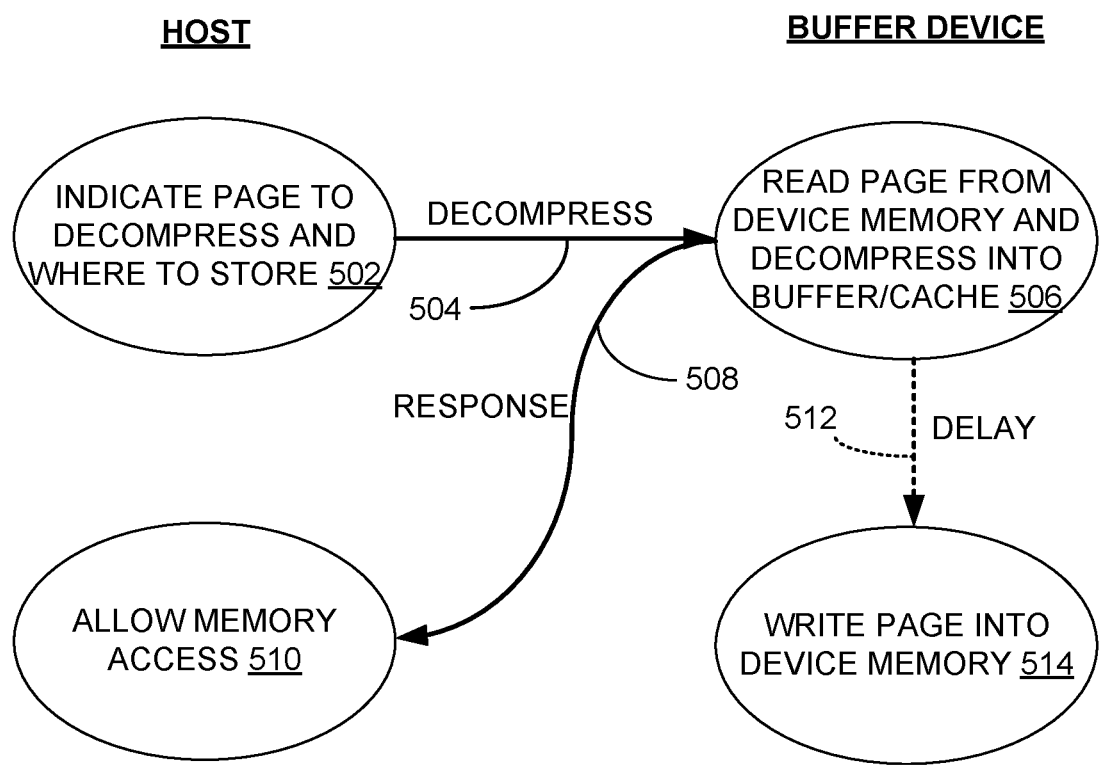
FIG. 5 illustrates one embodiment of a decompression operation between a host and a memory module that employs one embodiment of the IDE buffer device of FIG. 1.
Figure 6A:
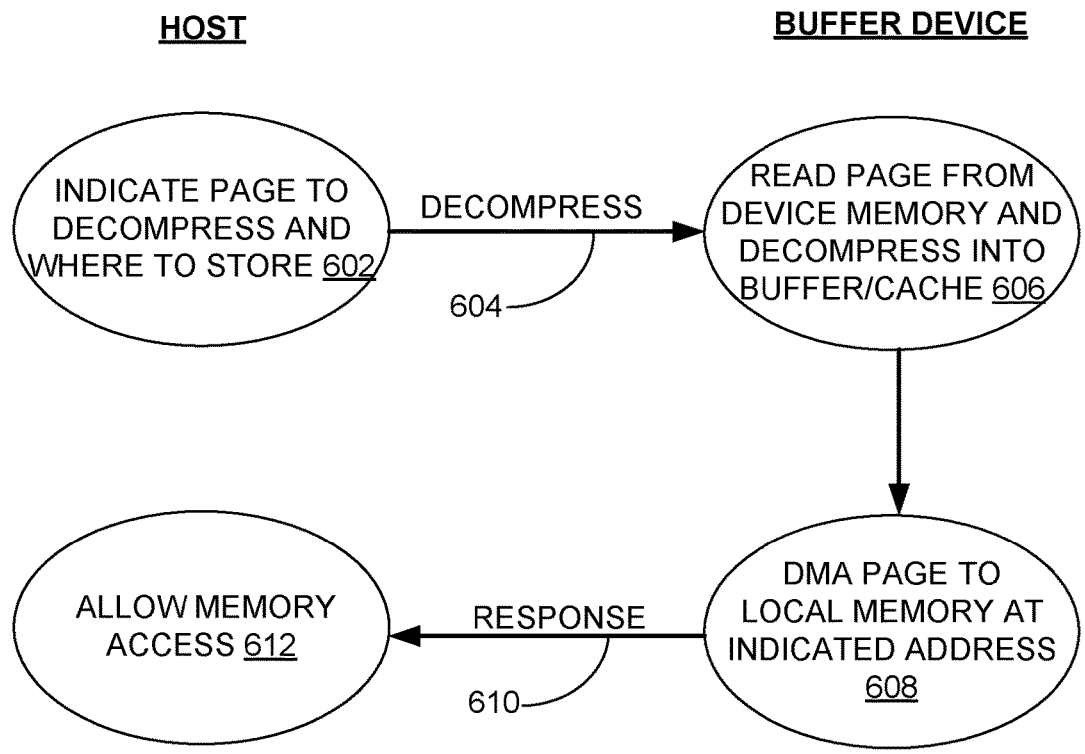
FIGS. 6A and 6B illustrate further embodiments of decompression operations similar to that of FIG. 5.
Figure 6B:
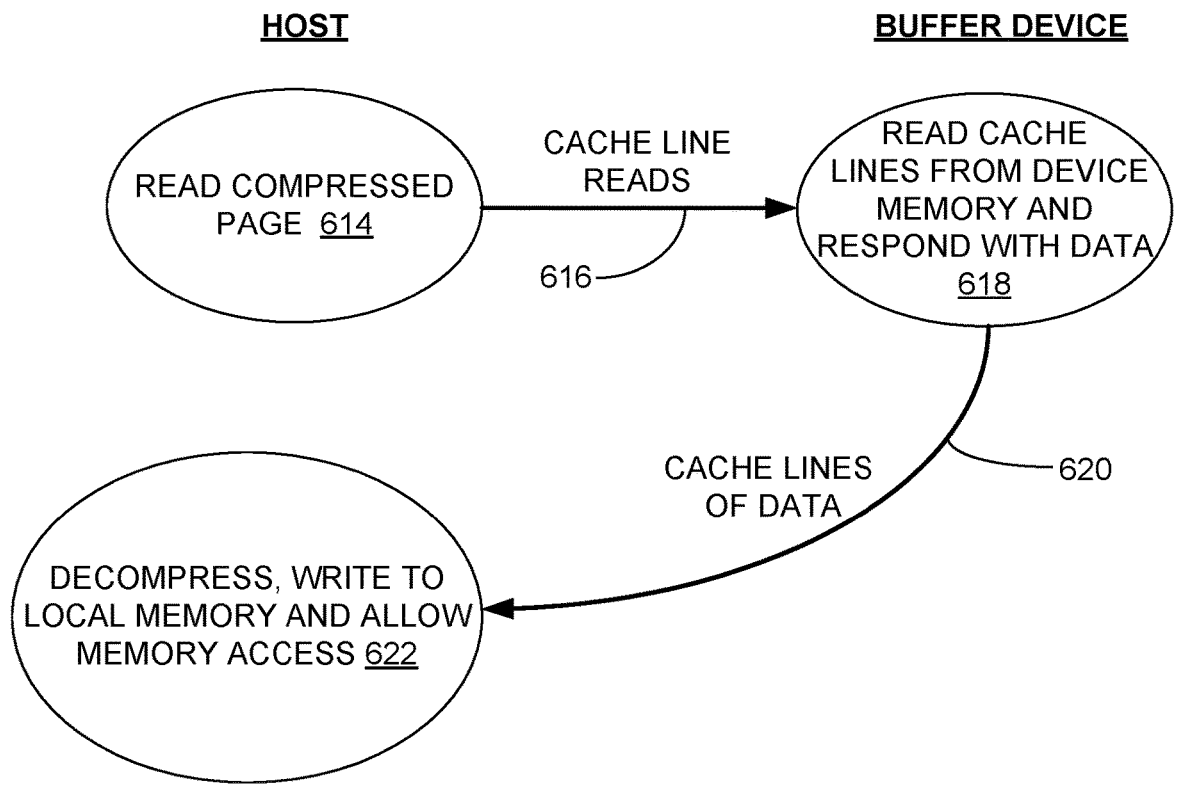

FIGS. 5, 6A and 6B illustrate respective state diagrams involving different forms of memory decompression operations between the host 102 and the buffer device 108. While the compression operations described above involve migrating pages from one region of memory to another, when the data associated with a migrated page of memory is needed, and a page fault needs to be completed, the host memory manager 104 undertakes control of the following operations to make the page associated with the data available for access. Referring now to FIG. 5, for one embodiment, the host memory manager 104 controls a device-to-device decompression operation. This involves the host memory manager 104 indicating a currently compressed page from the remote memory 114 to decompress, at 502, and dispatching a decompress command 504 and host physical address (HPA) information associated with the selected page to the buffer device 108. The HPA information may include the current HPA address for the compressed page, as well as a new HPA address for the decompressed page. In some situations, the two HPAs may be the same.

Further referring to FIG. 5, for one embodiment, the buffer device 108 responds to the decompress command by autonomously performing multiple operations to (1) retrieve the compressed page from the remote memory 114 and (2) control the decompression circuitry 116 to decompress the page into the queue/cache circuitry 118, at 506. For one embodiment, the buffer device 108, following the decompression operation, sends information representing the success or failure of the decompression operation, as a response back to the host 102, at 508. To reduce the latency of a page fault, in some situations the buffer device 108 may dispatch the failure or success response prior to completing the page decompression operation. Once the host memory manager 103 receives response 508, it may allow memory access to either the buffer device queue/cache circuitry 118 or the remote memory 114 by updating its allocated/unallocated page tables. The buffer device 108 may then act to either hold the decompressed page in the buffer device queue/cache circuitry 118 or write the uncompressed page to the remote memory 114. For embodiments that may not incorporate the queue/cache circuitry 118, the decompressed data may be directly written to the remote memory 114 without intermediate queueing/caching.

The steps illustrated in the state diagram of FIG. 5 generally correspond to a "stepped" transition of a given compressed page stored in the compressed remote memory tier 206 (FIG. 2) to the uncompressed remote memory tier 204 (FIG. 2). While FIG. 5 illustrates a device-to-device context for a decompression operation managed by the host memory manager 104 and carried out by the buffer device 108, FIG. 6A illustrates a state diagram for a device-to-host decompression operation that generally corresponds to a page being migrated from compressed remote memory 206 (FIG. 2) directly to uncompressed local memory 202 (FIG. 2).

Referring now to FIG. 6A, for one embodiment, the device-to-host decompression operation is performed in a device-driven manner, where the actual decompression is carried out by the buffer device 108. The operation begins with the host memory manager 104 selecting a page from compressed remote memory 206 (FIG. 2) to decompress and indicating an HPA for where to store the page, at 602. The host memory manager 104 may then dispatch a decompress command, at 604, along with HPA information, data size information in some embodiments, and new HPA information, to the buffer device 108. The buffer device 108 then reads the compressed page from the compressed remote memory 206 (FIG. 2) and decompresses the page into the buffer device queue/cache circuitry 118, at 606. The buffer device 108 then proceeds, at 608, by transferring the uncompressed data associated with the page as a response (a DMA operation to the host local memory 202), at 610, for writing to the indicated HPA of the local memory 202. The host memory manager 104 then updates its allocated/unallocated page tables and allows memory access to the selected address at 612. For a load and store memory architecture, the operations of FIG. 6A may involve multiple load/store operations, with the buffer device 108 performing direct memory access (DMA) read operations from the compressed remote memory 206 and write operations to the host local memory 202.

In one alternative embodiment, the device-to-host decompression operation is performed in a host-driven manner, where the actual decompression is carried out by the host device 102. Referring now to FIG. 6B, the operation begins with the host memory manager 104 reading the compressed page, at 614, by dispatching one or more cache line read commands to the buffer device 108, at 616. The buffer device 108 responds to the one or more read commands by reading cache lines from the compressed remote memory, at 618, and, at 620, sending the cache lines of compressed data as a response to the host 102. The host receives the compressed data and performs a decompression operation to generate the original uncompressed data, at 622, then writes the uncompressed data to local memory for access.

Figure 7:
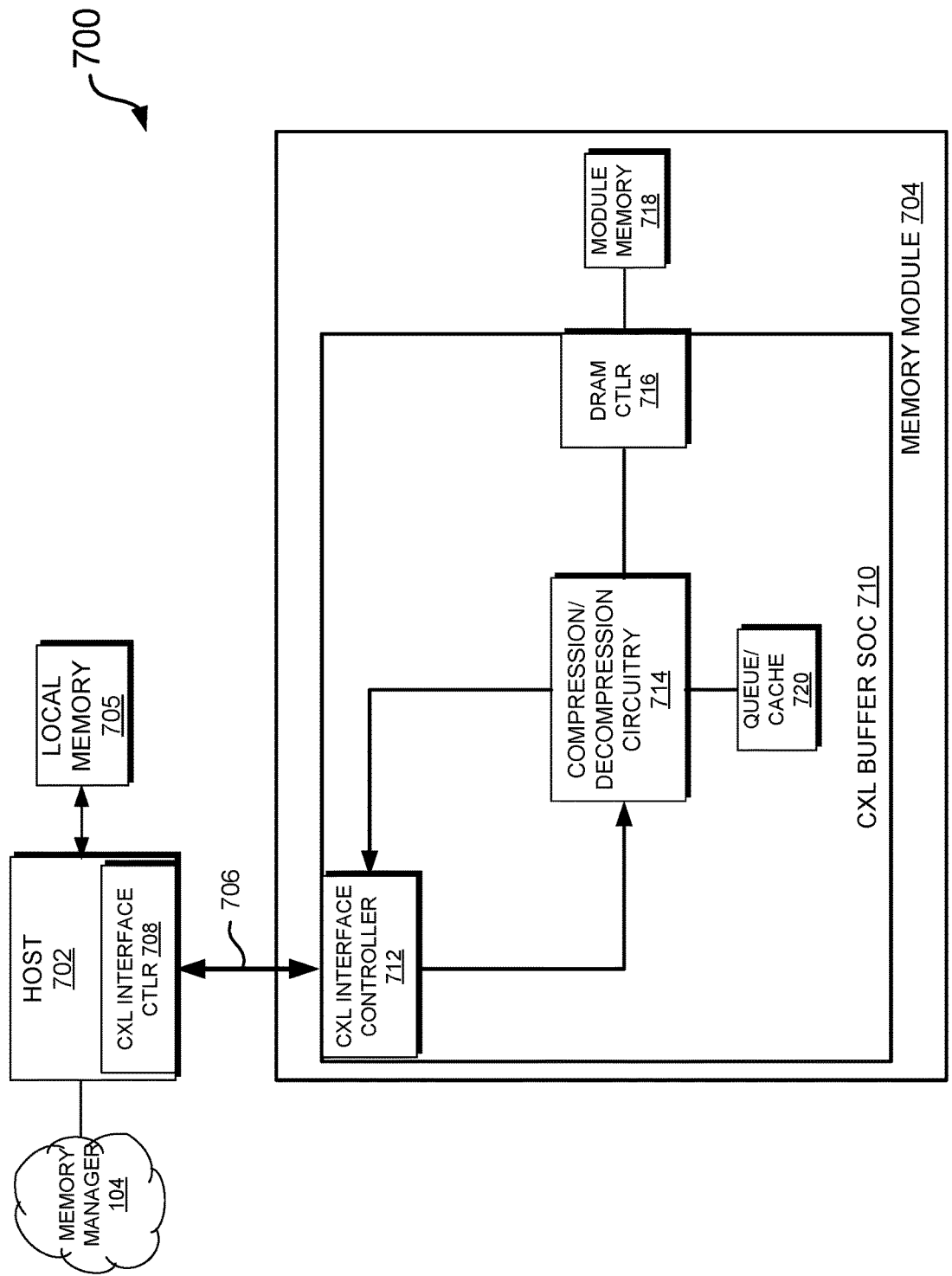
FIG. 7 illustrates one embodiment of a memory system employing a compute express link (CXL) buffer integrated circuit (IC) chip that is similar to the compressed memory buffer device of FIG. 1.

FIG. 7 illustrates one specific embodiment of a memory system, generally designated 700, that employs a CXL Type 3 memory device in the form of a CXL buffer system-on-chip (SOC) 710. The memory system 700 includes a host 702 that interfaces with a memory module 704 primarily through a CXL link 706. Similar to the system of FIG. 1, the host 702 manages memory via a host memory manager 703, and may include directly-connected local memory 705. For one embodiment, the host 702 includes a host CXL interface controller 708 for communicating over the CXL link 706 utilizing protocols consistent with the CXL standards, such as CXL.io and CXL.mem. For some embodiments that involve CXL Type 2 devices, an additional CXL.cache protocol may also be utilized.

Further referring to FIG. 7, the memory module 704 is configured to generally support a distributed CXL memory architecture, thus allowing one or more hosts such as host 702 to access module memory 718 that is disposed remote from the host 702. The module memory 718 may take the form of volatile memory, such as dynamic random access memory (DRAM) and/or non-volatile memory, such as Flash memory or a combination of multiple memory types, via the CXL buffer 710. For one embodiment, the CXL buffer 710 takes the form of a system-on-chip (SOC) and includes many of the features described above with respect to the buffer device 108 (FIG. 1).

With continued reference to FIG. 7, one embodiment of the CXL buffer 710 employs an overall architecture similar to that of FIG. 1, with a host interface that includes an in-band CXL external interface controller 712 and module memory control circuitry in the form of a dynamic random access memory (DRAM) controller 716. For one embodiment, the CXL buffer SOC 710 includes compression/decompression circuitry 714 that corresponds to the compression/decompression circuitry 116 of FIG. 1, providing hardware acceleration capability to perform memory compression and decompression operations in response to commands and/or other instructions received from the host 702. Data that is compressed/decompressed by the compression/decompression circuitry 714 may be stored in a temporary cache 720 and/or transferred to long-term storage in a compressed region of the module memory 718.

In operation, the memory system 700 of FIG. 7 generally undertakes compression and decompression operations similar to those described above with respect to FIGS. 3, 4A, 4B, 6A and 6B, albeit using CXL-related protocols.

Figure 8:
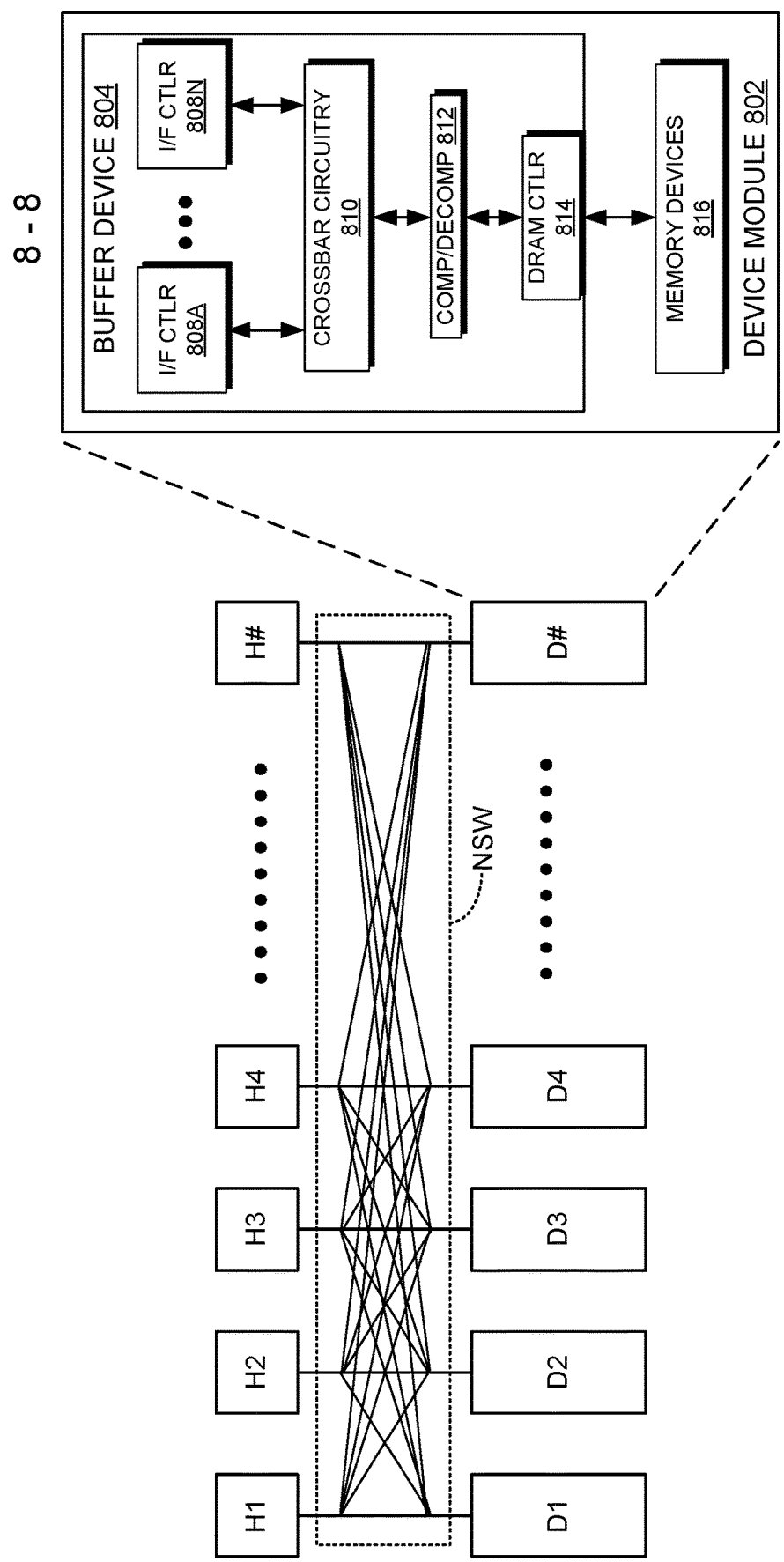
FIG. 8 illustrates a further embodiment of a memory system employing a compute express link (CXL) buffer integrated circuit (IC) chip that is similar to the system of FIG. 7.

FIG. 8 illustrates a further embodiment of a memory system, generally designated 800, that supports cross-coupled concurrent memory requests between multiple hosts H1-H # and a pooled memory of multiple device modules D1-D #. A network switch fabric NSW interconnects the various hosts and modules.

One embodiment of a device module 802, shown in magnified view 8-8, includes a buffer device 804 that accesses multiple memory devices 816. The buffer device 804 includes multiple interface controller ports 808A-808N that interface with the various hosts H-H #. Crossbar circuitry 810 connects to the multiple interface controller ports 808A-808N and selectively connects a given host H to the memory devices 816 for a given operation. Compression/decompression circuitry 812 interfaces the crossbar circuitry 810 to a DRAM controller 814. For one embodiment, the compression/decompression circuitry 812 may take the form of multiple independent circuit blocks to allow for distributed sharing of the circuitry between hosts and/or dedicated to a specific host with a specific region of memory.

Figure 9:
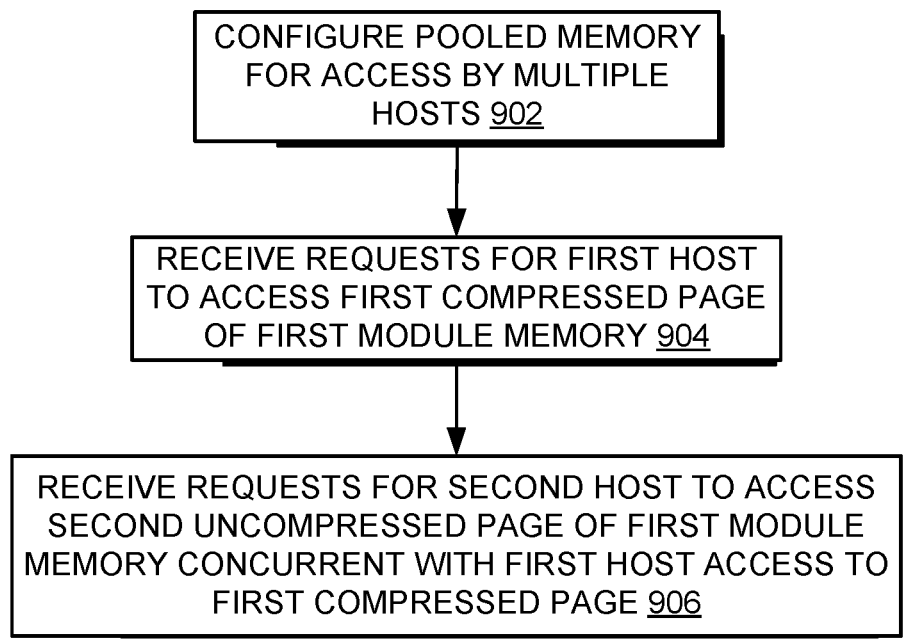
FIG. 9 illustrates one embodiment of a method of operating the memory system of FIG. 8.

In operation, the memory system 800 is capable of performing all of the operations described in relation to FIGS. 3, 4A, 4B, 5, 6A and 6B. In addition, due to the cross-coupled nature of the various hosts and memory modules, a variety of concurrent operations involving one or more hosts and modules are supported. For one embodiment, shown in FIG. 9, one method of operation involves configuring the pooled memory for access by multiple hosts, at 902. From the perspective of a given device module, such as 802, a first one of the interface controller ports 808A receives requests for a first one of the hosts H1 to access a first compressed page of module memory 816, at 904. During at least a portion of a time interval associated with the compressed page access, a second one of the interface controller ports 808B receives requests for a second one of the hosts H2 to access an uncompressed page of module memory 816, at 906.

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

We claim:

1. A buffer integrated circuit (IC) chip to provide load/store access to dynamic random access memory (DRAM) by at least one host, the DRAM disposed remotely from the at least one host and accessible by the at least one host via a network switch fabric, the at least one host directly connected to local memory, the buffer IC chip comprising:
   host interface circuitry to receive a request from the at least one host, the request received via the network switch fabric and including at least one command to perform a memory compression operation on first uncompressed data that is stored in a first memory region;
   compression circuitry, in response to the at least one command, to compress the first uncompressed data to first compressed data; and
   wherein the first compressed data is transferred to a second memory region, the second memory region being free to be a first portion of the local memory that is directly connected to the at least one host or a second portion of the DRAM that is disposed remotely from the at least one host.

2. The buffer IC chip of claim 1, wherein:
   the first uncompressed data is of a first data size;
   the first compressed data is of a second data size that is less than the first data size; and
   wherein the host interface circuitry transmits a value representing the second data size to the at least one host.

3. The buffer IC chip of claim 1, wherein:
   the first memory region comprises a first portion of the local memory.

4. The buffer IC chip of claim 1, wherein:
   the first memory region comprises a first portion of the DRAM.

5. The buffer IC chip of claim 1, wherein:
   the second memory region comprises a second portion of the local memory.

6. The buffer IC chip of claim 1, wherein:
   the second memory region comprises a second portion of the DRAM.

7. The buffer IC chip of claim 1, wherein:
   the compression circuitry is to compress the first uncompressed data during a first time interval, and wherein the host interface circuitry receives a second request from a second host to access second uncompressed data stored in the DRAM during a second time interval that at least partially overlaps the first time interval.

8. The buffer IC chip of claim 1, wherein:
the request includes an address indicating the second memory region in the DRAM for storing the first compressed data; and
wherein the buffer IC chip further includes memory interface circuitry to autonomously perform memory access operations, in response to receiving the address, to store the first compressed data in the second memory region of the DRAM specified by the address.

9. The buffer IC chip of claim 2, further comprising:
decompression circuitry, in response to a decompression command, to decompress the first compressed data to first decompressed data having the first data size.

10. A buffer integrated circuit (IC) chip to provide load/store access to dynamic random access memory (DRAM) by at least one host, the DRAM disposed remotely from the at least one host and accessible by the at least one host via a network switch fabric, the at least one host directly connected to local memory, the buffer IC chip comprising:
host interface circuitry to receive a request from the at least one host, the request received via the network switch fabric and including at least one command to perform a memory decompression operation on first compressed data that is stored in a first memory region;
decompression circuitry, in response to the at least one command, to decompress the first compressed data to first decompressed data; and
wherein the first decompressed data is transferred to a second memory region, the second memory region being free to be a first portion of the local memory that is directly connected to the at least one host or a second portion of the DRAM that is disposed remotely from the at least one host.

11. The buffer IC chip of claim 10, wherein:
the host interface circuitry is to receive the first compressed data as compressed by the at least one host in accordance with a first compression scheme and received by the host interface circuitry from the at least one host; and
wherein the decompression circuitry decompresses the first compressed data with a decompression scheme that is compatible with the first compression scheme.

12. The buffer IC chip of claim 10, wherein:
the request includes an address indicating the second memory region in the DRAM for storing the first decompressed data; and
wherein the buffer IC chip further includes memory interface circuitry to autonomously perform memory access operations, in response to receiving the address, to store the first decompressed data in the second memory region of the DRAM specified by the address.

13. The buffer IC chip of claim 10, wherein:
the request includes an address indicating the second memory region in a host memory for storing the first decompressed data; and
wherein the buffer IC chip further includes memory interface circuitry to autonomously perform memory access operations, in response to receiving the address, to retrieve the first compressed data from the first memory region of the DRAM;

wherein the decompression circuitry, in response to receiving the address and the first compressed data from the memory interface circuitry, autonomously decompresses the first compressed data as first decompressed data; and
wherein the host interface circuitry transfers the first decompressed data to the at least one host for storage in the second memory region of the host memory specified by the address.

14. The buffer IC chip of claim 10, wherein:
the decompression circuitry is to autonomously decompress the first compressed data during a first time interval, and wherein the host interface circuitry receives a second request from a second host to access second uncompressed data stored in the DRAM during a second time interval that at least partially overlaps the first time interval.

15. The buffer IC chip of claim 10, embodied as a Compute Express Link (CXL) buffer chip.

16. A memory module, comprising:
a substrate;
multiple dynamic random access memory (DRAM) devices disposed on the substrate; and
a buffer integrated circuit (IC) chip to provide load/store access to the multiple DRAM devices by at least one remote host, the buffer IC chip comprising:
host interface circuitry to receive a request via a network switch fabric from the at least one remote host, the request including at least one command to perform a memory compression operation on first uncompressed data that is stored in a first memory region, the first uncompressed data having a first data size; and
compression circuitry, in response to the at least one command, to compress the first uncompressed data to first compressed data having a second data size;
wherein the first compressed data is transferred to a second memory region, the second memory region being free to be a first portion of a local memory that is directly connected to the at least one remote host or a second portion of the DRAM that is disposed remotely from the at least one remote host.

17. The memory module of claim 16, wherein:
the host interface circuitry transmits a value representing the second data size to the at least one remote host.

18. The memory module of claim 16, wherein:
the host interface circuitry includes multiple ports to interface with multiple remote hosts; and
wherein the buffer IC chip further comprises crossbar circuitry to interconnect a given portion of the multiple DRAM devices to one or more of the multiple remote hosts.

19. The memory module of claim 18, wherein:
the memory module is configured as a portion of an aggregate memory pool of remote memory.

20. The memory module of claim 19, wherein:
the compression circuitry is to compress the first uncompressed data associated with the at least one remote host during a first time interval, and wherein the host interface circuitry receives a second request from a second remote host to access second uncompressed data stored in a portion of the multiple DRAM devices during a second time interval that at least partially overlaps the first time interval.

* * * * *